US012633902B2

(12) United States Patent
Kimura

(10) Patent No.: US 12,633,902 B2
(45) Date of Patent: May 19, 2026

(54) ELASTIC WAVE FILTER, DEMULTIPLEXER, AND COMMUNICATION APPARATUS

(71) Applicant: KYOCERA CORPORATION, Kyoto (JP)

(72) Inventor: Toshiya Kimura, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 86 days.

(21) Appl. No.: 18/845,797

(22) PCT Filed: Mar. 9, 2023

(86) PCT No.: PCT/JP2023/009014
§ 371 (c)(1),
(2) Date: Sep. 10, 2024

(87) PCT Pub. No.: WO2023/171741
PCT Pub. Date: Sep. 14, 2023

(65) Prior Publication Data
US 2025/0192753 A1      Jun. 12, 2025

(30) Foreign Application Priority Data

Mar. 11, 2022    (JP) ................................ 2022-038498

(51) Int. Cl.
*H03H 9/64*          (2006.01)
*H03H 9/02*          (2006.01)
(Continued)

(52) U.S. Cl.
CPC ...... *H03H 9/6489* (2013.01); *H03H 9/02559* (2013.01); *H03H 9/02866* (2013.01);
(Continued)

(58) Field of Classification Search
CPC ...... H03H 9/6483; H03H 9/25; H03H 9/1457; H03H 9/02992; H03H 9/145;
(Continued)

(56) References Cited

U.S. PATENT DOCUMENTS

| | | | |
|---|---|---|---|
| 12,009,800 B2 * | 6/2024 | Nozoe ................ | H03H 9/02574 |
| 2016/0261038 A1 * | 9/2016 | Tanaka ..................... | H03H 9/64 |

FOREIGN PATENT DOCUMENTS

JP          2020-102662 A      7/2020

* cited by examiner

*Primary Examiner* — Lincoln D Donovan
*Assistant Examiner* — Tyler J Pereny
(74) *Attorney, Agent, or Firm* — Volpe Koenig

(57)          ABSTRACT

To improve the frequency characteristics of an elastic wave filter. The elastic wave filter includes series resonators and parallel resonators as oblique resonators. In the series resonator, a duty of each of dummy electrode fingers is greater than a duty of each of electrode fingers in at least a part of a first intersection region where the electrode fingers intersect in the series resonator, and a duty at a base portion of each of the electrode fingers is greater than the duty of each of the electrode fingers in at least a part of the first intersection region. In the parallel resonator, the duty of each of the dummy electrode fingers is within a range of ±0.08 with respect to the duty of each of the electrode fingers in at least a part of a second intersection region where the electrode fingers intersect in the parallel resonator, and the duty at a base portion of each of the electrode fingers is within a range of ±0.08 with respect to the duty of each of the electrode fingers in at least a part of the second intersection region.

17 Claims, 10 Drawing Sheets

(51) Int. Cl.
    *H03H 9/145*         (2006.01)
    *H03H 9/25*           (2006.01)
    *H03H 9/72*           (2006.01)

(52) U.S. Cl.
    CPC .... *H03H 9/02992* (2013.01); *H03H 9/14547*
         (2013.01); *H03H 9/25* (2013.01); *H03H*
         *9/6483* (2013.01); *H03H 9/72* (2013.01)

(58) Field of Classification Search
    CPC .. H03H 9/02574; H03H 9/64; H03H 9/02559;
        H03H 9/725; H03H 9/14541; H03H
        9/6496; H03H 9/72; H03H 9/02866;
        H03H 9/54; H03H 9/542; H03H 9/02881;
        H03H 9/14573; H03H 9/02858; H03H
        9/14526; H03H 9/205; H03H 9/14547;
        H03H 9/02228; H03H 9/02637; H03H
        9/14594; H03H 9/0274; H03H 9/13;
        H03H 9/14558; H03H 9/17; H03H
        9/02015; H03H 9/6436; H03H 9/1452;
        H03H 9/6489; H03H 9/02818; H03H
        9/02834; H03H 9/02937; H03H 9/14544;
        H03H 9/14591; H03H 9/02157; H03H
        9/02543; H03H 9/14502; H03H 9/568;
        H03H 9/14552; H03H 9/02716; H03H
        9/14564; H03H 3/08; H04B 1/0057;
        H04B 1/006
    See application file for complete search history.

RESONATOR CHARACTERISTICS

7000A

7000B

8000A

8000B

8000C

— SOLID LINE: EXAMPLE
　　　　　SERIES RESONATOR IS TYPE-1 OBLIQUE RESONATOR AND
　　　　　PARALLEL RESONATOR IS TYPE-2 OBLIQUE RESONATOR

– – BROKEN LINE: COMPARATIVE EXAMPLE
　　　　　SERIES RESONATOR IS TYPE-1 OBLIQUE RESONATOR AND
　　　　　PARALLEL RESONATOR IS TYPE-1 OBLIQUE RESONATOR

FILTER CHARACTERISTICS

PARALLEL RESONATOR CHARACTERISTICS IN FILTER

ELASTIC WAVE FILTER, DEMULTIPLEXER, AND COMMUNICATION APPARATUS

TECHNICAL FIELD

An aspect of the present disclosure relates to an elastic wave filter element.

BACKGROUND OF INVENTION

Patent Document 1 below discloses a configuration example of an elastic wave element.

CITATION LIST

Patent Literature

Patent Document 1: JP 2020-102662 A

SUMMARY

An elastic wave filter according to an aspect of the present disclosure includes at least one series resonator including a first IDT electrode; and at least one parallel resonator including a second IDT electrode, wherein the at least one series resonator and the one parallel resonator include a common piezoelectric film, the first IDT electrode includes: a first bus bar and a second bus bar facing each other in a direction intersecting a propagation direction of an elastic wave propagating through the piezoelectric film; a plurality of first electrode fingers connected to the first bus bar; a plurality of second electrode fingers connected to the second bus bar and interleaved with the plurality of first electrode fingers; a plurality of first dummy electrode fingers connected to the first bus bar and facing tips of the plurality of second electrode fingers, respectively; and a plurality of second dummy electrode fingers connected to the second bus bar and facing tips of the plurality of first electrode fingers, respectively, a direction in which the tips of the plurality of first electrode fingers are connected and a direction in which the tips of the plurality of second electrode fingers are connected are inclined with respect to the propagation direction, the second IDT electrode includes: a third bus bar and a fourth bus bar facing each other in the direction intersecting the propagation direction; a plurality of third electrode fingers connected to the third bus bar; a plurality of fourth electrode fingers connected to the fourth bus bar and interleaved with the plurality of third electrode fingers; a plurality of third dummy electrode fingers connected to the third bus bar and facing tips of the plurality of fourth electrode fingers, respectively; and a plurality of fourth dummy electrode fingers connected to the fourth bus bar and facing tips of the plurality of third electrode fingers, respectively, a direction in which the tips of the plurality of third electrode fingers are connected and a direction in which the tips of the plurality of fourth electrode fingers are connected are inclined with respect to the propagation direction, in the at least one series resonator, a duty of the first dummy electrode fingers and a duty of the second dummy electrode fingers are greater than a duty of the first electrode fingers and a duty of the second electrode fingers in at least a part of a first intersection region where the first electrode fingers and the second electrode fingers intersect with each other, a duty at a base portion of the first electrode fingers and a duty at a base portion of the second electrode fingers are greater than the duty of the first electrode fingers and the duty of the second electrode fingers in at least a part of the first intersection region, and in at least one of the at least one parallel resonator, a duty of the third dummy electrode fingers and a duty of the fourth dummy electrode fingers are within a range of ±0.08 with respect to a duty of the third electrode fingers and a duty of the fourth electrode fingers in at least a part of a second intersection region where the third electrode fingers and the fourth electrode fingers intersect with each other, and a duty at a base portion of the third electrode fingers and a duty at a base portion of the fourth electrode fingers are within a range of ±0.08 with respect to the duty of the third electrode fingers and the duty of the fourth electrode fingers in at least a part of the second intersection region.

DESCRIPTION OF EMBODIMENTS

First Embodiment

An elastic wave filter 100 of a first embodiment is described below. For convenience of description, a member having the same function as that of a member described in the first embodiment is denoted by the same reference sign in each of subsequent embodiments, and a description thereof is not repeated. For simplification, descriptions of known technical matters are omitted as appropriate. Unless otherwise specified, each configuration and each numerical value described in the present specification are merely examples. Accordingly, unless otherwise specified, the positional relationship between the members is not limited to an example in each drawing. Each member is not necessarily illustrated to scale.

Configuration Example of Elastic Wave Filter 100

Figures 1, 2:
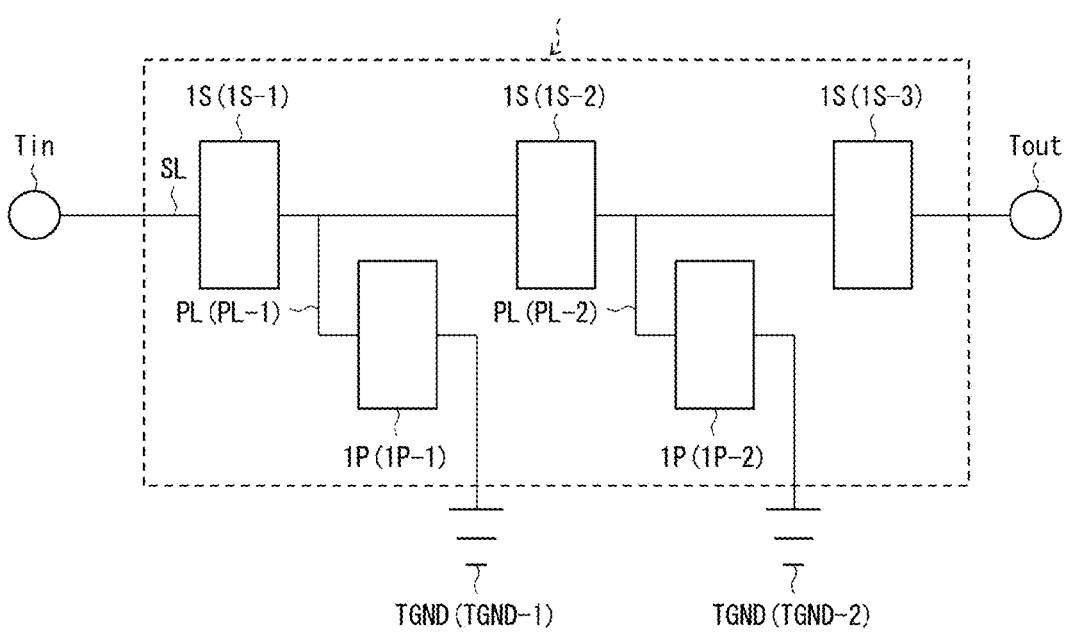
FIG. 1 is a diagram illustrating a configuration example of an elastic wave filter in a first embodiment.
FIG. 2 is a plan view illustrating a configuration example of a series resonator (type-1 oblique resonator) in the elastic wave filter in FIG. 1.

FIG. 1 is a diagram illustrating a configuration example of the elastic wave filter 100. The elastic wave filter 100 may include at least one series resonator 1S and at least one parallel resonator 1P as a plurality of elastic wave elements (resonators). As illustrated in FIG. 1, the elastic wave filter 100 may be a ladder-type filter in which the series resonators 1S and the parallel resonators 1P are arranged in a ladder shape.

The elastic wave filter 100 in the example of FIG. 1 includes three series resonators 1S and two parallel resonators 1P. In the present specification, when the three series resonators 1S are distinguished from one another, they are referred to as series resonators 1S-1 to 1S-3, respectively. In the present specification, when the two parallel resonators 1P are distinguished from each other, they are referred to as parallel resonators 1P-1 and 1P-2, respectively.

As illustrated in FIG. 1, the elastic wave filter 100 may be connected to an input terminal Tin and an output terminal Tout. Hereinafter, for example, the input terminal Tin is simply abbreviated as Tin as appropriate. The elastic wave filter 100 may be configured as a frequency filter that filters an electrical signal input to Tin and outputs the filtered electrical signal to Tout.

The elastic wave filter 100 may include a series wiring SL that connects the plurality of series resonators 1S and a plurality of parallel wirings PL that connect the plurality of parallel resonators 1P. The elastic wave filter 100 may be connected to a plurality of ground terminals TGNDs corresponding to the plurality of PLs, respectively. In the example of FIG. 1, the elastic wave filter 100 includes two PLs. Accordingly, the elastic wave filter 100 is connected to two TGNDs. When the two PLs are distinguished from each other, they are referred to as PL-1 and PL-2, respectively. When the two TGNDs are distinguished from each other, they are referred to as TGND-1 and TGND-2, respectively.

SL may be connected to Tin and Tout. Accordingly, each of the series resonators 1S-1 to 1S-3 may be connected to Tin and Tout via SL. In the example of FIG. 1, the series resonator 1S-1 is a series resonator closest to Tin. On the other hand, the series resonator 1S-3 is a series resonator closest to Tout (in other words, farthest from Tin).

In the example of FIG. 1, the parallel resonator 1P-1 is a parallel resonator closest to Tin. On the other hand, the parallel resonator 1P-2 is a parallel resonator closest to Tout. PL-1 branches off from SL between the series resonators 1S-1 and 1S-2, and is connected to TGND-1. PL-2 branches off from SL between the series resonators 1S-2 and 1S-3, and is connected to TGND-2. In this way, the parallel resonators 1P-1 and 1P-2 may be connected to TGND-1 and TGND-2 via PL-1 and PL-2, respectively. According to this configuration, an unnecessary component included in an electrical signal is discharged to TGND via the parallel resonator 1P, so that the electrical signal can be filtered.

Another Configuration Example of Elastic Wave Filter 100

The elastic wave filter 100 may be a frequency filter including at least one series resonator 1S and at least one parallel resonator 1P. Accordingly, as is apparent to those skilled in the art, the elastic wave filter 100 may be, for example, a multimode filter.

Configuration Example of Series Resonator 1S

FIG. 2 is a plan view illustrating a configuration example of the series resonator 1S. The series resonator 1S is an example of a type-1 oblique resonator to be described below. In the first embodiment, a surface acoustic wave (SAW) element is illustrated as an example of a resonator. In the following description, for convenience, an orthogonal coordinate system (xyz coordinate system) illustrated in FIG. 1 is introduced. In the example of the first embodiment, an x direction is a propagation direction of an elastic wave propagating through a piezoelectric film 2 of the series resonator 1S. On the other hand, a y direction is an example of a direction intersecting the x direction in the plan view.

Figure 3:
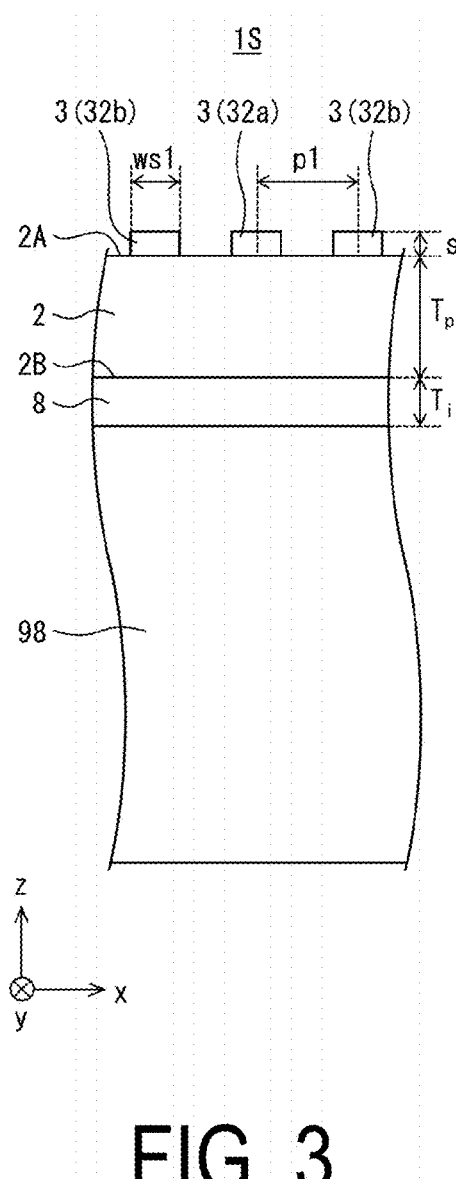
FIG. 3 is a cross-sectional view taken along line III-III in FIG. 2.

FIG. 3 is a cross-sectional view taken along line III-III in FIG. 2. As illustrated in FIG. 3, a z direction in the example of the first embodiment is a thickness direction of each member of the series resonator 1S. In the following, a positive direction of the z direction is taken as an upper side, and the term "upper surface" is used. A negative direction of the z direction is taken as a lower side, and the term "lower surface" is used.

As is apparent to those skilled in the art, an elastic wave according to an aspect of the present disclosure is not limited to SAW. The elastic wave may be any wave that can conceptualize the propagation direction. The elastic wave may be, for example, a bulk acoustic wave (BAW). Therefore, another example of the resonator according to an aspect of the present disclosure includes a BAW element. Accordingly, an elastic wave filter according to an aspect of the present disclosure may be a SAW filter or a BAW filter.

The series resonator 1S may include (i) the piezoelectric film 2, (ii) a first interdigital transducer (IDT) electrode 3 located on an upper surface 2A of the piezoelectric film 2, (iii) a support substrate 98, and (iv) a low acoustic velocity film 8. The IDT electrode is also referred to as an excitation electrode. In the example of FIG. 2, the first IDT electrode 3 is located between two ports (terminals) P1 and P2. The ports P1 and P2 may be an input port and an output port of the first IDT electrode 3, respectively.

As illustrated in FIG. 2, the series resonator 1S may include a pair of reflectors 4A and 4B corresponding to the first IDT electrode 3. In the present specification, the reflectors 4A and 4B are also collectively referred to as reflectors 4. The reflectors 4 may be located while interposing the first IDT electrode 3 therebetween in the x direction.

The piezoelectric film 2 may be made of a single crystal material having piezoelectric properties. For example, the material of the piezoelectric film 2 may be lithium tantalate ($LiTaO_3$: also referred to as LT) or lithium niobate ($LiNbO_3$: also referred to as LN). As an example, the piezoelectric film 2 may be an LT film.

The support substrate 98 supports each part of the series resonator 1S. Accordingly, as illustrated in FIG. 3, the support substrate 98 may be located on a lower surface 2B side of the piezoelectric film 2. The support substrate 98 may be configured so that the acoustic velocity of an elastic wave propagating through the support substrate 98 is higher than the acoustic velocity of an elastic wave propagating through the piezoelectric film 2. This configuration can improve the loss characteristics of the resonator. Therefore, the loss of the elastic wave filter 100 can be reduced. Examples of a material for the support substrate 98 include Si, sapphire, quartz crystal, and AlN. As an example, the support substrate 98 may be a Si substrate.

The low acoustic velocity film 8 may be located between the piezoelectric film 2 and the support substrate 98. Accordingly, as illustrated in FIG. 3, the low acoustic velocity film 8 may be located below the piezoelectric film 2 and above the support substrate 98. The piezoelectric film 2 and the support substrate 98 may be bonded to each other via the low acoustic velocity film 8. The low acoustic velocity film 8 may be configured so that the acoustic velocity of an elastic wave propagating through the low acoustic velocity film 8 is lower than the acoustic velocity of the elastic wave propagating through the piezoelectric film 2. This configuration can improve the loss characteristics of the resonator. Therefore, the loss of the elastic wave filter 100 can be reduced. Examples of a material for the low acoustic velocity film 8 include silicon oxide ($SiO_x$). As an example, the low acoustic velocity film 8 may be a $SiO_2$ film.

As an example, in the present specification, the "low acoustic velocity" means a bulk wave acoustic velocity lower than the acoustic velocity of a bulk wave propagating through the piezoelectric film 2. The "high acoustic velocity" means a bulk wave acoustic velocity higher than the acoustic velocity of the bulk wave propagating through the piezoelectric film 2. The acoustic velocity of the bulk wave may be compared with the acoustic velocity of any one of a longitudinal wave, a fast transverse wave, and a slow transverse wave as a reference.

As illustrated in FIG. 3, in the present specification, the thickness of the first IDT electrode 3 is represented as s, the electrode finger pitch of the first IDT electrode 3 is represented as p1, the thickness of the piezoelectric film 2 is represented as Tp, and the thickness of the low acoustic velocity film 8 is represented as Ti. p1 is, for example, the pitch (repetition interval) between the centers of a plurality of electrode fingers 32 (to be described below) of the first IDT electrode 3 in the x direction. As an example, p1 may be set to be equal to half ($\lambda/2$) the wavelength of an elastic wave excited by the first IDT electrode 3. In this case, the wavelength $\lambda$ of the elastic wave can be defined as twice the length of p1. That is, $\lambda$ can be defined as 2×p1.

The first IDT electrode 3 may include a first comb electrode 30a (comb electrode on the port P1 side) and a second comb electrode 30b (comb electrode on the port P2 side). In the present specification, the first comb electrode 30a and the second comb electrode 30b are also collectively referred to as comb electrodes 30. In the following description, in the first IDT electrode 3, the subscript a is appropriately given to each member corresponding to the first comb electrode, and the subscript b is appropriately given to each member corresponding to the second comb electrode. For these members, the generic name corresponding to the comb electrode 30 is also appropriately used.

The comb electrode 30 may include two bus bars 31 (a first bus bar 31a and a second bus bar 31b) facing each other in the y direction. The bus bar 31 may have a substantially constant width and may be formed in an elongated shape extending linearly. However, the width of the bus bar 31 may not necessarily be constant.

In addition, the comb electrode 30 may include the plurality of electrode fingers 32 extending in the y direction from one bus bar 31 (for example, the first bus bar 31a) to the other bus bar 31 (for example, the second bus bar 31b) side. First electrode fingers 32a and second electrode fingers 32b may be alternately and repeatedly located on the upper surface 2A of the piezoelectric film 2 at substantially constant intervals in the x direction. As above, the first electrode fingers 32a may be connected to the first bus bar 31a. The second electrode fingers 32b may be connected to the second bus bar 31b and interleaved with the plurality of first electrode fingers 32a.

In addition, the comb electrode 30 may include a plurality of dummy electrode fingers 35 extending in the y direction from the one bus bar 31 (for example, the first bus bar 31a) to the other bus bar 31 (for example, the second bus bar 31b) side and facing tips of the electrode fingers 32 extending from the other bus bar 31. The pitch of the dummy electrode fingers 35 may be set to a value equal to the pitch of the electrode fingers 32.

Accordingly, first dummy electrode fingers 35a may be connected to the first bus bar 31a and may face the tips of the plurality of second electrode fingers 32b, respectively. For example, the first dummy electrode finger 35a may face the tip of each of the plurality of second electrode fingers 32b via a gap. Second dummy electrode fingers 35b may be connected to the second bus bar 31b and may face the tips of the plurality of first electrode fingers 32a, respectively. For example, the second dummy electrode finger 35b may face the tip of each of the plurality of first electrode fingers 32a via a gap.

As illustrated in FIG. 2, a direction in which the tips of the plurality of first electrode fingers 32a are connected may be inclined with respect to the x direction. In other words, a virtual line L1 connecting the tips of the plurality of first electrode fingers 32a may be inclined with respect to the x direction. In this way, the virtual line L1 may form a certain inclination angle A1 (first inclination angle) with respect to an x axis.

A direction in which the tips of the plurality of second electrode fingers 32b are connected may be inclined with respect to the x direction. In other words, a virtual line L2 connecting the tips of the plurality of second electrode fingers 32b may be inclined with respect to the x direction. In this way, the virtual line L2 may form a certain inclination angle B1 (second inclination angle) with respect to the x axis.

The first inclination angle and the second inclination angle may be set to be equal to each other, or may be set to be different from each other. FIG. 2 illustrates an example in which the first inclination angle and the second inclination angle are equal to each other. In the present specification, a resonator in which the first inclination angle and the second inclination angle are nonzero is referred to as an oblique resonator. A resonator (to be described below) in which a third inclination angle and a fourth inclination angle are nonzero is also referred to as an oblique resonator. The oblique resonator can reduce transverse mode spurious (transverse mode ripple) generated in the resonator (see Patent Document 1).

In the present specification, a region where the first electrode finger 32a and the second electrode finger 32b intersect is referred to as a first intersection region. The shape of the first intersection region may be defined by (i) the virtual lines L1 and L2 and (ii) the electrode fingers 32 located on the reflector 4 side. In the example of FIG. 2, the shape of the first intersection region is a parallelogram. Accordingly, FIG. 2 illustrates the IDT electrode 3 having a parallelogram shape.

In the present specification, the length of the electrode finger 32 in the x direction is referred to as the width of the electrode finger 32. A width ws1 of each of the electrode fingers 32 (see FIG. 3) may be appropriately set according to, for example, electrical characteristics required for the series resonator 1S. As an example, ws1 may be set according to p1 (pitch of the electrode fingers 32). In the present specification, the ratio of the width of a certain electrode finger to the pitch of the electrode finger, that is, ws1/p1, is referred to as the duty (Duty) of the electrode finger. ws1 may be substantially constant. However, ws1 may not necessarily be constant throughout the y direction in one electrode finger 32. In the following description, ws1 refers to, for example, the width of the electrode finger 32 at the center portion of the first intersection region.

As illustrated in FIG. 2, a width ws2 of the second dummy electrode finger 35b may be set to be larger than the width ws1 of the electrode finger 32 in at least a part of the first intersection region. A width ws3 of the first dummy electrode finger 35a may be set to be larger than the width ws1 of the electrode finger 32 in at least a part of the first intersection region. In the example of FIG. 2, ws2 and ws3 are set equal to each other.

As above, ws2 and ws3 may be set to be larger than the width ws1 of the electrode fingers 32 (for example, the width of the first electrode finger and the width of the second electrode finger) in at least a part of the first intersection region. This configuration can further reduce the transverse mode spurious in the series resonator 1S. As an example, ws2 and ws3 may be set to be larger than an average value of the widths w1 of the plurality of electrode fingers 32 in an intersection region.

In the example of FIG. 2, a region on the first bus bar 31*a* side from a virtual line L3 connecting the tips of the first dummy electrode fingers 35*a* is referred to as a first dummy region. A region on the second bus bar 31*b* side from a virtual line L4 connecting the tips of the second dummy electrode fingers 35*b* is referred to as a second dummy region. As illustrated in FIG. 2, the width of the first electrode finger 32*a* (base portion of the first electrode finger 32*a*) located on the first dummy electrode finger side may be set to be larger than ws1. The width of the second electrode finger 32*b* (base portion of the second electrode finger 32*b*) located on the second dummy electrode finger side may also be set to be larger than ws1. In the example of FIG. 2, the width of the base portion of each electrode finger 32 is set to a value equal to ws2. In this way, the base portion of the electrode finger 32 may be formed to be wider than the other portions of the electrode finger. This configuration can effectively reduce transverse mode ripples in the series resonator 1S (see Patent Document 1).

In the following description, for convenience, the Duty of the first dummy electrode finger 35*a* and the Duty of the second dummy electrode finger 35*b* are referred to as Dutyd1 and Dutyd2, respectively. The Duty of the first electrode finger 32*a* and the Duty of the second electrode finger 32*b* are referred to as Duty1 and Duty2, respectively.

As is apparent from the above descriptions of the relationship among ws1 to ws3, Dutyd1 and Dutyd2 may be set to be greater than Duty1 and Duty2 in at least a part of the first intersection region. This configuration can further reduce the transverse mode spurious in the series resonator 1S.

As an example, Dutyd1 and Dutyd2 may be set to be 0.08 or more greater than Duty1 and Duty2 in at least a part of the first intersection region. More specifically, Dutyd1 and Dutyd2 may be set to be within a range from +0.08 to +0.16 with respect to Duty1 and Duty2 in at least a part of the first intersection region.

Dutyd1 and Dutyd2 may be set to be greater than Duty1 and Duty2 in the center portion of the first intersection region. Dutyd1 and Dutyd2 may be set to be greater than Duty1 and Duty2 in the entire first intersection region. This configuration can further reduce the transverse mode spurious in the series resonator 1S.

In addition, Duty1 at the base portion of the first electrode finger 32*a* and Duty2 at the base portion of the second electrode finger 32*b* may be set to be greater than Duty1 and Duty2 of the second electrode finger in at least a part of the first intersection region. This configuration can further reduce the transverse mode spurious in the series resonator 1S.

As an example, Duty1 at the base portion of the first electrode finger 32*a* and Duty2 at the base portion of the second electrode finger 32*b* may be set to be 0.08 or more greater than Duty1 and Duty2 in at least a part of the first intersection region. For example, Duty1 at the base portion of the first electrode finger 32*a* and Duty2 at the base portion of the second electrode finger 32*b* may be within a range from +0.08 to +0.16 with respect to Duty 1 and Duty2 in at least a part of the first intersection region.

Duty1 at the base portion of the first electrode finger 32*a* and Duty2 at the base portion of the second electrode finger 32*b* may be set to be greater than Duty1 and Duty2 at the center portion of the first intersection region. Duty1 at the base portion of the first electrode finger 32*a* and Duty2 at the base portion of the second electrode finger 32*b* may be set to be greater than Duty1 and Duty2 in the entire first intersection region.

In the present specification, an oblique resonator in which (i) Duty of each dummy electrode finger is greater than Duty of each electrode finger in at least a part of the intersection region (for example, the first intersection region) and (ii) Duty at the base portion of each electrode finger is greater than Duty of each electrode finger in at least a part of the intersection region is referred to as a type-1 oblique resonator. An example of the frequency characteristics of the type-1 oblique resonator is described below.

Configuration Example of Parallel Resonator 1P

Figure 4:
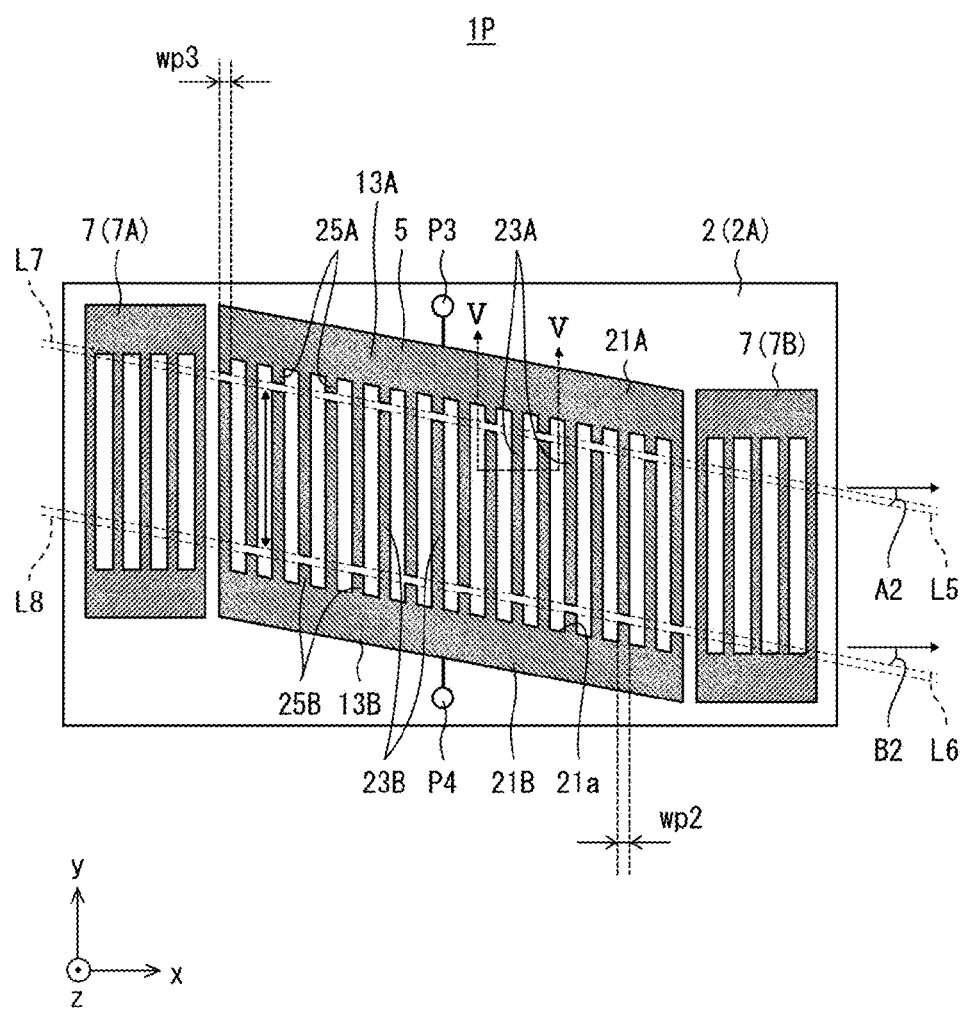
FIG. 4 is a plan view illustrating a configuration example of a parallel resonator (type-2 oblique resonator) in the elastic wave filter in FIG. 1.
Figure 5:
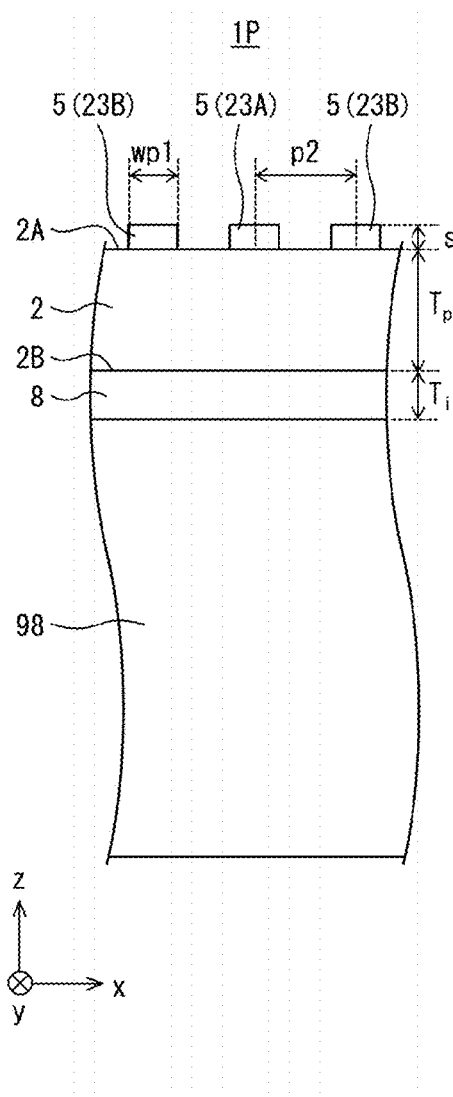
FIG. 5 is a cross-sectional view taken along line V-V in FIG. 4.

FIG. 4 is a plan view illustrating a configuration example of the parallel resonator 1P. The parallel resonator 1P is an example of a type-2 oblique resonator to be described below. FIG. 5 is a cross-sectional view taken along line V-V in FIG. 4. As described below, the parallel resonator 1P may be located on the same chip as the series resonator 1S. Accordingly, the parallel resonator 1P may also include the support substrate 98 common to the series resonator 1S. Therefore, the parallel resonator 1P may also include the piezoelectric film 2 common to the series resonator 1S. The parallel resonator 1P may also include the low acoustic velocity film 8 common to the series resonator 1S.

The parallel resonator 1P may include a second IDT electrode 5 located on the upper surface 2A of the piezoelectric film 2. In the example of FIG. 4, the second IDT electrode 5 is located between two ports P3 and P4. The ports P3 and P4 may be an input port and an output port of the parallel resonator 1P, respectively. The parallel resonator 1P may include a pair of reflectors 7A and 7B corresponding to the second IDT electrode 5. In the present specification, the reflectors 7A and 7B are also collectively referred to as reflectors 7. The reflectors 7 may be located while interposing the second IDT electrode 5 therebetween in the x direction.

As illustrated in FIG. 5, in the present specification, the electrode finger pitch of the second IDT electrode 5 is referred to as p2, and the width of the electrode finger 23 (to be described below) is referred to as wp1. In the example of FIG. 5, the second IDT electrode 5 has the same thickness(s) as the first IDT electrode 3. p2 is, for example, a pitch in the x direction between the centers of a plurality of electrode fingers 23. As an example, p2 may be set equal to half ($\lambda$/2) the wavelength of an elastic wave excited by the second IDT electrode 5. In this case, the wavelength $\lambda$ of the elastic wave can be defined as twice the length of p2. That is, $\lambda$ can also be defined as 2×p2. In the present specification, $\lambda$ may be defined with p1 as a reference or p2 as a reference.

The second IDT electrode 5 may include a first comb electrode 13A (comb electrode on the port P3 side) and a second comb electrode 13B (comb electrode on the port P4 side). In the present specification, the first comb electrode 13A and the second comb electrode 13B are also collectively referred to as comb electrodes 13. In the following description, in the second IDT electrode 5, the subscript A is appropriately given to each member corresponding to the first comb electrode, and the subscript B is appropriately given to each member corresponding to the second comb electrode. For these members, the generic name corresponding to the comb electrode 13 is also appropriately used.

The comb electrode 13 may include two bus bars 21 (a third bus bar 21A and a fourth bus bar 21B) facing each other in the y direction. The comb electrode 13 may include the plurality of electrode fingers 23 extending in the y direction from one bus bar 21 (for example, the third bus bar 21A) to the other bus bar 21 (for example, the fourth bus bar 21B) side. Third electrode fingers 23A may be connected to the third bus bar 21A. Fourth electrode fingers 23B may be connected to the fourth bus bar 21B and may be interleaved with the plurality of third electrode fingers 23A.

In addition, the comb electrode 30 may include a plurality of dummy electrode fingers 25 extending in the y direction from the one bus bar 21 (for example, the third bus bar 21A) to the other bus bar 21 (for example, the fourth bus bar 21B) side and facing tips of the electrode fingers 23 extending from the other bus bar 31. The pitch of the dummy electrode fingers 25 may be set to a value equal to the pitch of the electrode fingers 23.

Accordingly, third dummy electrode fingers 25A may be connected to the third bus bar 21A and may face the tips of the plurality of fourth electrode fingers 23B, respectively. For example, the third dummy electrode finger 25A may face the tip of each of the plurality of fourth electrode fingers 23B via a gap. Fourth dummy electrode fingers 25B may be connected to the fourth bus bar 21B and may face the tips of the plurality of third electrode fingers 23A, respectively. For example, the fourth dummy electrode finger 25B may face the tip of each of the plurality of third electrode fingers 23A via a gap.

As illustrated in FIG. 4, a direction in which the tips of the plurality of third electrode fingers 23A are connected may be inclined with respect to the x direction. In other words, a virtual line L5 connecting the tips of the plurality of third electrode fingers 23A may be inclined with respect to the x direction. In this way, the virtual line L5 may form a certain inclination angle A2 (third inclination angle) with respect to the x axis.

A direction in which the tips of the plurality of fourth electrode fingers 23B are connected may be inclined with respect to the x direction. In other words, a virtual line L6 connecting the tips of the plurality of fourth electrode fingers 23B may be inclined with respect to the x direction. In this way, the virtual line L6 may form a certain inclination angle B2 (fourth inclination angle) with respect to the x axis.

The third inclination angle and the fourth inclination angle may be set to be equal to each other, or may be set to be different from each other. FIG. 4 illustrates an example in which the third inclination angle and the fourth inclination angle are equal to each other. As above, the parallel resonator 1P in FIG. 4 is common to the series resonator 1S in FIG. 1 in that the parallel resonator 1P is an oblique resonator.

In the present specification, a region where the third electrode finger 23A and the fourth electrode finger 23B intersect is referred to as a second intersection region. The shape of the second intersection region may be defined by (i) the virtual lines L5 and L6 and (ii) the electrode fingers 23 located on the reflector 7 side. The above-described wp1 may be substantially constant. However, wp1 may not necessarily be constant throughout the y direction in one electrode finger 23. In the following description, wp1 refers to, for example, the width of the electrode finger 23 at the center portion of the second intersection region.

As illustrated in FIG. 4, a width wp2 of the fourth dummy electrode finger 25B may be set to a value substantially equal to the width wp1 of the electrode finger 23 in at least a part of the second intersection region. A width wp3 of the third dummy electrode finger 25A may also be set to a value substantially equal to the width wp1 of the electrode finger 23 in at least a part of the second intersection region. In the example of FIG. 1, wp2 and wp3 are set equal to each other.

In the example of FIG. 4, a region on the third bus bar 21A side from a virtual line L7 connecting the tips of the plurality of third dummy electrode fingers 25A is referred to as a third dummy region. A region on the fourth bus bar 21B side of a virtual line L8 connecting the tips of the plurality of fourth dummy electrode fingers 25B is referred to as a fourth dummy region. As illustrated in FIG. 4, the width of the third electrode finger 23A (base portion of the third electrode finger 23A) located on the third dummy electrode finger side may be set to a value substantially equal to wp1. The width of the fourth electrode finger 23B (base portion of the fourth electrode finger 23B) located on the fourth dummy electrode finger side may also be set to a value substantially equal to wp1. In this way, the base portion of each electrode finger 23 may have a width substantially equal to the rest of the electrode finger.

In the following description, for convenience, Duty of the third dummy electrode finger 25A and Duty of the fourth dummy electrode finger 25B are referred to as Dutyd3 and Dutyd4, respectively. Duty of the third electrode finger 23A and Duty of the fourth electrode finger 23B are referred to as Duty3 and Duty4, respectively.

As is apparent from the above descriptions of the relationship among wp1 to wp3, Dutyd3 and Dutyd4 may be set to be substantially equal to Duty3 and Duty4 in at least a part of the second intersection region.

As an example, in the second IDT electrode 5, a "certain Duty is substantially equal to another Duty" may mean that the "certain Duty is within a range of ±0.08 with respect to the other Duty". Dutyd3 and Dutyd4 may be within a range of ±0.08 with respect to Duty3 and Duty4 in at least a part of the second intersection region.

For example, Dutyd3 and Dutyd4 may be set to be greater than Duty1 and Duty2 in the center portion of the second intersection region. Dutyd3 and Dutyd4 may be set to be greater than Duty3 and Duty4 in the entire second intersection region.

In addition, Duty3 at the base portion of the third electrode finger 23A and Duty4 at the base portion of the fourth electrode finger 23B may be set to be substantially equal to Duty3 and Duty4 of the second electrode finger in at least a part of the second intersection region. For example, Duty3 at the base portion of the third electrode finger 23A and Duty4 at the base portion of the fourth electrode finger 23B may be set to be substantially equal to Duty3 and Duty4 in the center portion of the second intersection region. Duty3 at the base portion of the third electrode finger 23A and Duty4 at the base portion of the fourth electrode finger 23B may be set to be greater than Duty3 and Duty4 in the entire second intersection region.

As is apparent from the above descriptions of the magnitude of Duties in the second IDT electrode 5, Duty 3 at the base portion of the third electrode finger 23A and Duty 4 at the base portion of the fourth electrode finger 23B may be within a range of ±0.08 with respect to Duty 3 and Duty 4 in at least a part of the second intersection region.

In the present specification, an oblique resonator in which (i) Duty of each dummy electrode finger is substantially equal to Duty of each electrode finger in at least a part of the intersection region (for example, the second intersection region) and (ii) Duty at the base portion of each electrode finger is substantially equal to Duty of each electrode finger in at least a part of the intersection region is referred to as a type-2 oblique resonator. An example of the frequency characteristics of the type-2 oblique resonator is described below.

In the elastic wave filter 100, at least one of the at least one parallel resonator 1P (for example, one of the two parallel resonators 1P) may be a type-2 oblique resonator. Accordingly, for example, in the elastic wave filter 100, all of the at least one parallel resonator 1P may be type-2 oblique resonators.

Figure 6:
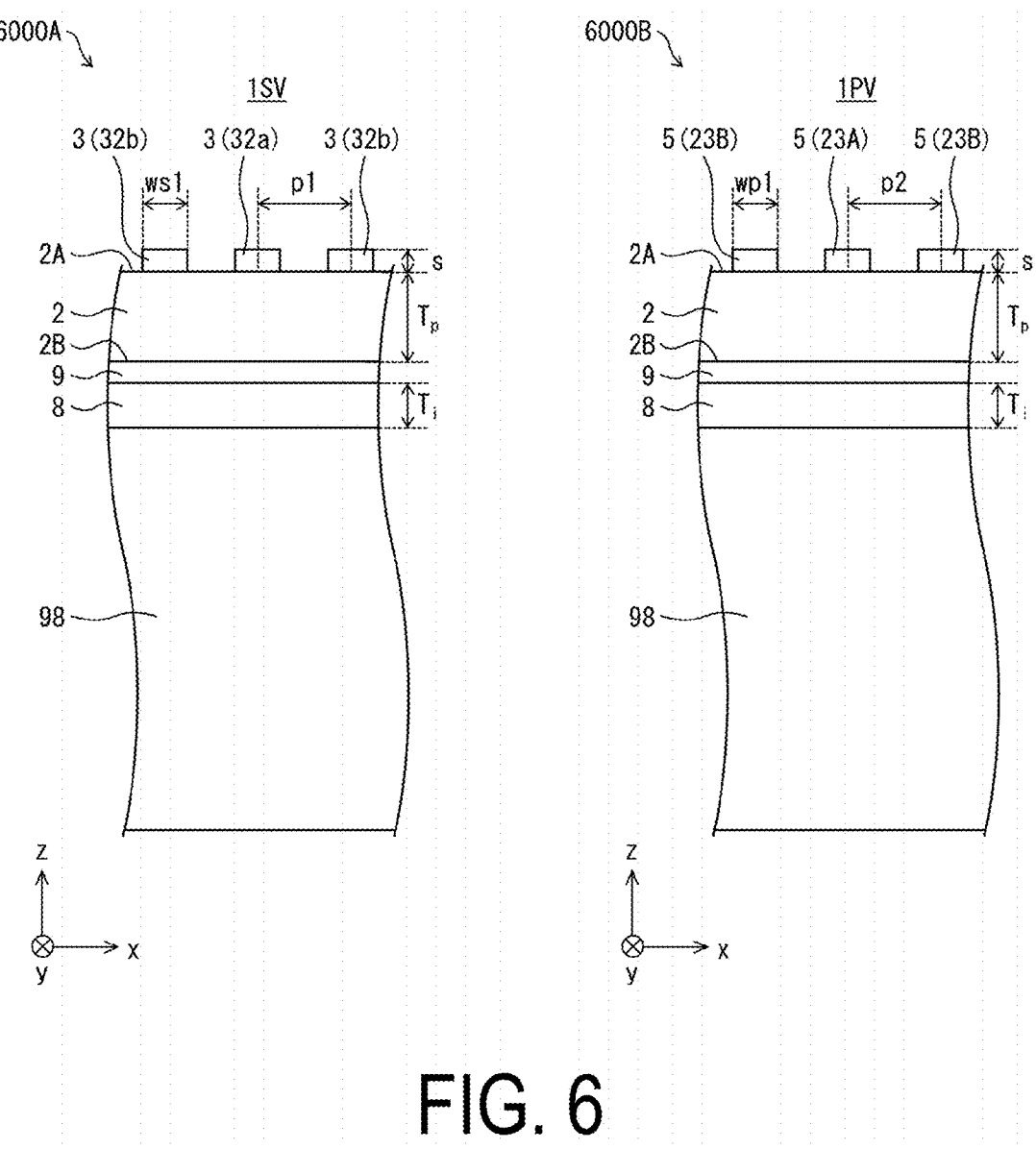
FIG. 6 is a diagram illustrating another configuration example of a series resonator and a parallel resonator.

Another Configuration Example of Series Resonator 1S and Parallel Resonator 1P FIG. 6 is a diagram illustrating another configuration example of the series resonator 1S and the parallel resonator 1P. In FIG. 6, (i) reference sign 6000A indicates a series resonator 1SV being another configuration example of the series resonator 1S, and (ii) reference sign 6000B indicates a parallel resonator 1PV being another configuration example of the parallel resonator 1P.

The series resonator 1SV and the parallel resonator 1PV may have a common high acoustic velocity film 9. The high acoustic velocity film 9 may be configured so that the acoustic velocity of an elastic wave propagating through the high acoustic velocity film 9 is higher than the acoustic velocity of the elastic wave propagating through the piezo-electric film 2. As illustrated in FIG. 6, the high acoustic velocity film 9 may be located between the piezoelectric film 2 and the low acoustic velocity film 8. Accordingly, for example, the high acoustic velocity film 9 may be located below the piezoelectric film 2 and above the low acoustic velocity film 8. By providing the high acoustic velocity film 9, the loss characteristics of the resonator can be improved. Therefore, the loss of the elastic wave filter 100 can be reduced.

Figure 7:
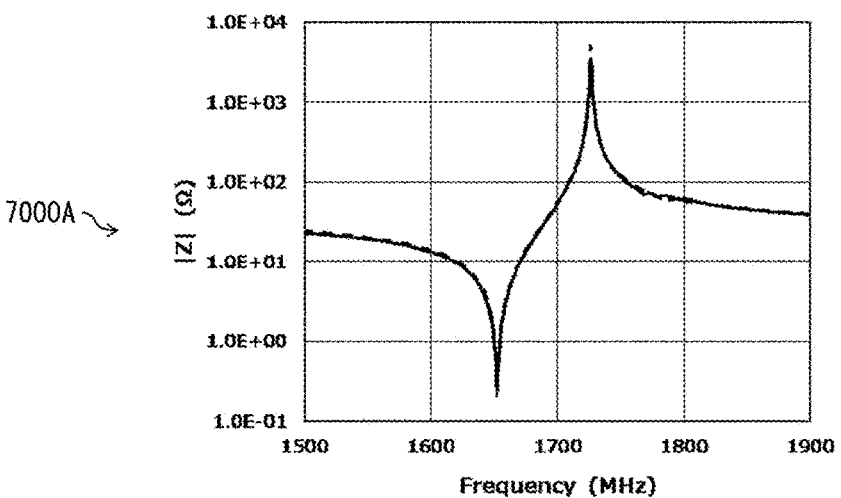
FIG. 7 is a diagram illustrating frequency characteristics of each of a type-1 oblique resonator and a type-2 oblique resonator.
Figure 7:
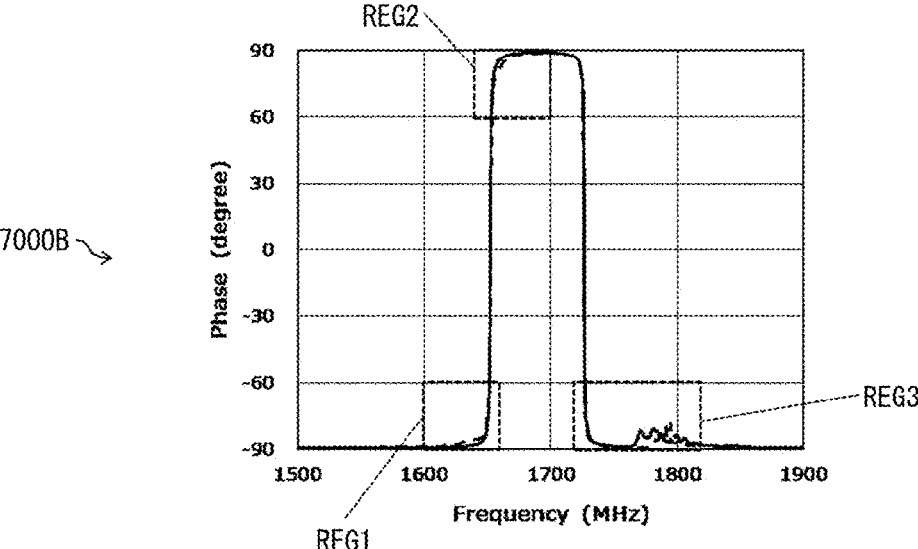

Examples of a material for the high acoustic velocity film 9 include $Al_2O_3$. Accordingly, the high acoustic velocity film 9 may be an $Al_2O_3$ film. Note that the position of the high acoustic velocity film 9 is not limited to the example in FIG. 6. As another example, the high acoustic velocity film 9 may be located between the low acoustic velocity film 8 and the support substrate 98. Accordingly, for example, the high acoustic velocity film 9 may be located below the low acoustic velocity film 8 and above the support substrate 98. Example of Frequency Characteristics of Each Oblique Resonator FIG. 7 is a diagram illustrating the frequency character-istics of each of the type-1 oblique resonator and the type-2 oblique resonator. In each graph in FIG. 7, the solid line indicates the characteristics of the type-1 oblique resonator, and the dotted line indicates the characteristics of the type-2 oblique resonator.

The design conditions for the type-1 oblique resonator and the type-2 oblique resonator in the example of FIG. 7 are as follows:

Tp (thickness of LT film as common dielectric film): 0.5 μm

Thickness of $Al_2O_3$ film (common high acoustic velocity film): 0.01 nm

Ti (thickness of $SiO_2$ film as common low acoustic velocity film): 0.3 μm

Resistivity of Si (common support substrate): 10 kΩ·cm

Electrode finger pitch of each IDT electrode: 1.17 μm

Configuration of each IDT electrode: Ti 60 Å/AlCu 1400 Å

Intersection width (width of intersection region): 16λ

Number of electrode fingers in each IDT electrode: 400

Duty of electrode finger in intersection region of each IDT electrode: 0.5

Inclination angle: −6° Under the above design conditions, the first inclination angle to the fourth inclination angle are collectively referred to as inclination angles. Under the design conditions, since p1=p2=1.17 μm, 2=2.34 μm (=1.17 μm×2). That is, Tp is equivalent to 0.213λ. In this way, Tp may be λ or less. This configuration can improve the loss characteristics of the resonator by making the piezoelectric film 2 thinner. Therefore, the loss of the elastic wave filter 100 can be reduced.

In the type-1 oblique resonator in the example of FIG. 7, Duty1 is set to 0.5 and Duty2 is set to 0.5 in the entire first intersection region. In the type-1 oblique resonator, Duty at the base portion of the first electrode finger is set to 0.66, Duty at the base portion of the second electrode finger is set to 0.66, Dutyd1 is set to 0.66, and Dutyd2 is set to 0.66. On the other hand, in the type-2 oblique resonator in the example of FIG. 7, Duty3 is set to 0.5 and Duty4 is set to 0.5 in the entire second intersection region. In the type-2 oblique resonator, Duty at the base portion of the third electrode finger is set to 0.5, Duty at the base portion of the fourth electrode finger is set to 0.5, Dutyd3 is set to 0.5, and Dutyd4 is set to 0.5.

In each graph of FIG. 7, a horizontal axis indicates a frequency (unit: MHz). In FIG. 7, the graph with reference sign 7000A indicates the impedance characteristics of each resonator. In the graph, a vertical axis indicates the absolute value (magnitude) of an impedance (unit: Ohm). The graph with reference sign 7000B indicates the phase characteristics of the impedance of each oblique resonator. In the graph, a vertical axis indicates the phase of the impedance (unit: degree). In the following description, the phase of the impedance is simply abbreviated as "phase".

The main resonant frequency of a certain resonator is a frequency at which the absolute value of the impedance of the resonator is minimum. The main resonant frequency is also a frequency at which the phase is 0° in a frequency band where the phase increases monotonically. The anti-resonant frequency of the certain resonator is a frequency at which the absolute value of the impedance of the resonator is maxi-mum. The anti-resonant frequency is also a frequency at which the phase is 0° in a frequency band where the phase decreases monotonically. In the example of FIG. 7, each oblique resonator has a main resonant frequency and an anti-resonant frequency substantially equal to each other. The passband of an elastic wave filter is defined by the main resonant frequency and the anti-resonant frequency of each resonator included in the elastic wave filter.

Figure 8:
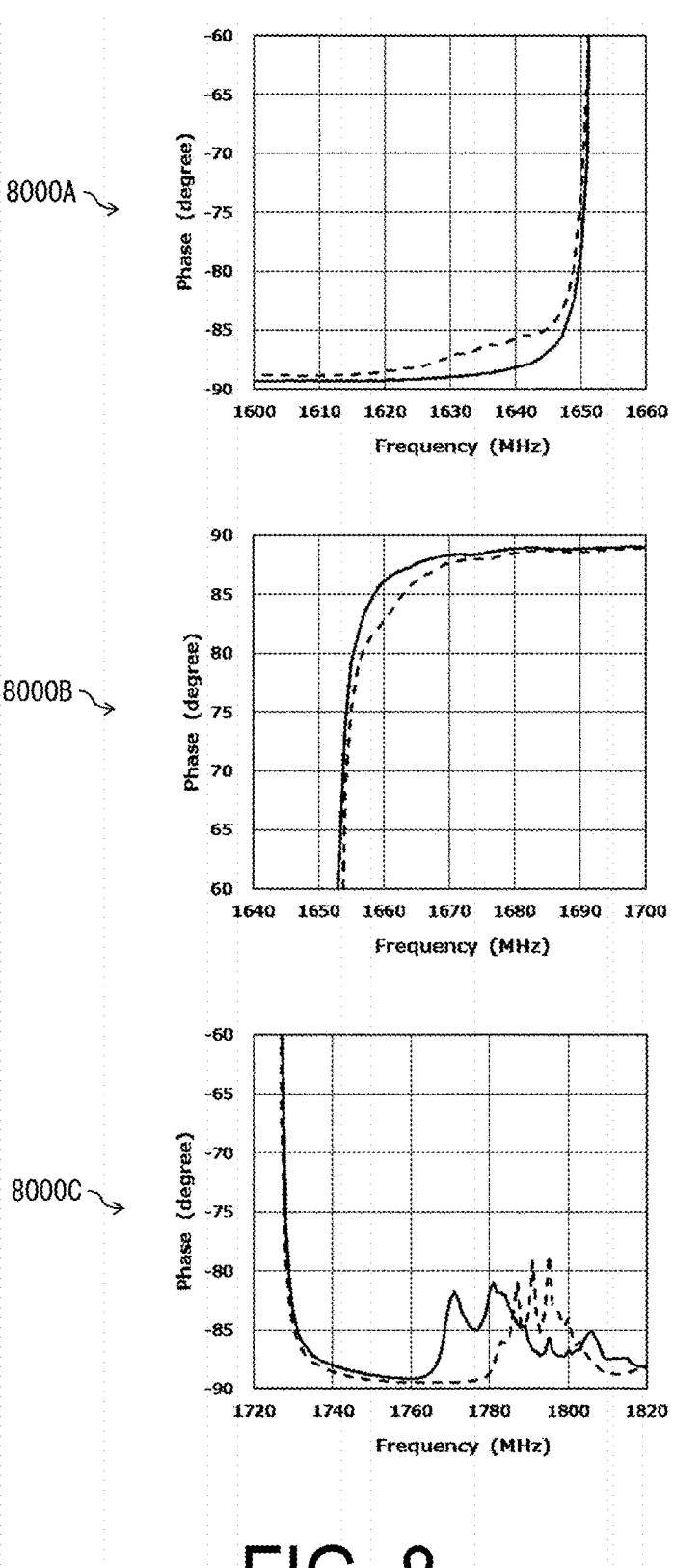
FIG. 8 is an enlarged view of regions REG1 to REG3 in FIG. 7.

FIG. 8 illustrates an enlarged view of regions REG1 to REG3 in the graph with reference sign 7000B in FIG. 7. In FIG. 8, reference sign 8000A indicates an enlarged view of the region REG1. The graph with reference sign 8000A enlarges a phase domain around −90° in a first frequency band (1600 to 1660 MHz). The first frequency band is an example of a frequency band including the main resonant frequency of each oblique resonator.

As shown in the graph with reference sign 8000A, in the first frequency band, the phase of the type-1 oblique reso-nator is smaller than the phase of the type-2 oblique reso-nator. This represents that the type-1 oblique resonator can reduce transverse mode spurious generated in the cutoff band of an elastic wave filter on a low-frequency side more effectively than the type-2 oblique resonator.

Reference sign 8000B indicates an enlarged view of the region REG2. The graph with reference sign 8000B enlarges a phase domain around 90° in a second frequency band (1640 to 1700 MHz). The second frequency band is another example of a frequency band including the main resonant frequency of each oblique resonator.

The maximum value of the phase (hereinafter, referred to as MaxPhase) is one of indices indicating the performance of the resonator. The ideal maximum value of MaxPhase is 90°. It is known that the higher MaxPhase (that is, the closer MaxPhase is to 90°), the smaller the resonance loss in the resonator.

As shown in the graph with reference sign 8000B, in the second frequency band, the phase of the type-1 oblique resonator is larger than the phase of the type-2 oblique resonator. That is, MaxPhase of the type-1 oblique resonator is higher than MaxPhase of the type-1 oblique resonator. This represents that the type-1 oblique resonator can reduce resonance loss more effectively than the type-2 oblique resonator.

As shown in the graphs with reference signs 8000A and 8000B, the type-1 oblique resonator can more effectively reduce transverse mode spurious, and as a result, can more effectively reduce resonance loss. As can be understood from the above descriptions, the effect is obtained by the configuration of the type-1 oblique resonator (for convenience, referred to as type-1 configuration) in which (i) Duty of each dummy electrode finger is greater than Duty of each electrode finger in at least a part of the intersection region and (ii) Duty at the base portion of each electrode finger is greater than Duty of each electrode finger in at least a part of the intersection region.

Reference sign 8000C indicates an enlarged view of the region REG3. The graph with reference sign 8000C enlarges a phase domain around –90° in a third frequency band (1720 to 1820 MHz). The third frequency band is an example of a frequency band including the anti-resonant frequency of each oblique resonator. As shown in the graph with reference sign 8000C, in the third frequency band, stopband spurious in the type-1 oblique resonator is located at a lower frequency side than stopband spurious in the type-2 oblique resonator. The reduction in the frequency of such stopband spurious is considered to be a side effect caused by the above-described type-1 configuration.

Figure 9:
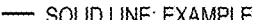
FIG. 9 is a diagram illustrating the relationship between the type of a parallel resonator and frequency characteristics of an elastic wave filter.
Figure 9:
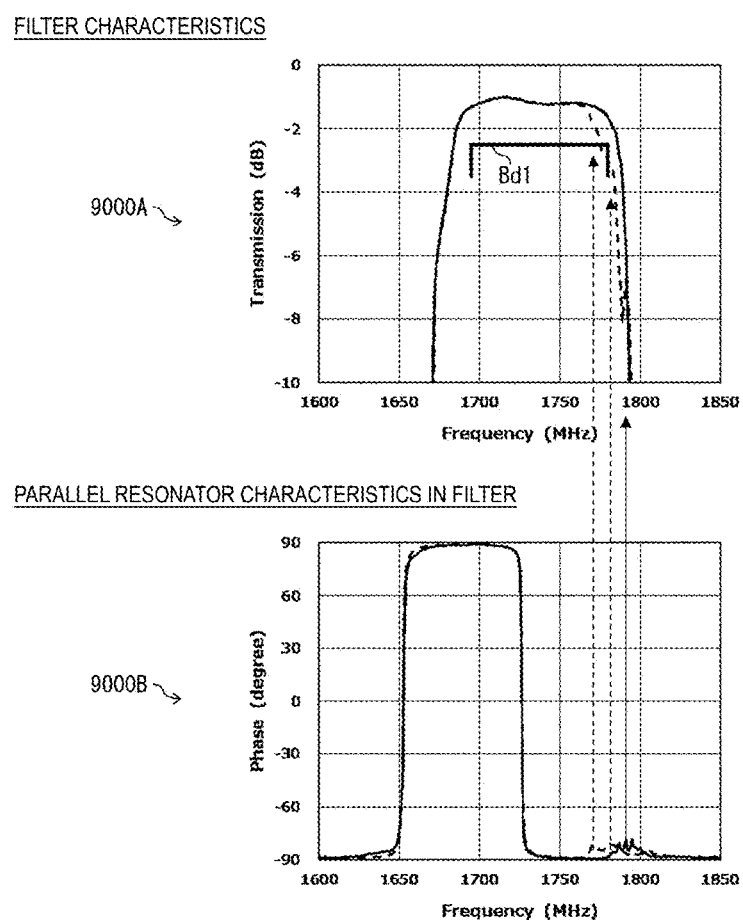

Example of Relationship Between Type of Parallel Resonator and Frequency Filter of Elastic Wave Filter FIG. 9 is a diagram illustrating an example of the relationship between the type of a parallel resonator and frequency characteristics (more specifically, attenuation characteristics) of an elastic wave filter. The graph with reference sign 9000A in FIG. 9 illustrates the frequency characteristics of an elastic wave filter according to an example (for example, the elastic wave filter 100) and an elastic wave filter according to a comparative example.

In the elastic wave filter according to the example (hereinafter, abbreviated as "example"), a series resonator is a type-1 oblique resonator and a parallel resonator is a type-2 oblique resonator. The design conditions of each oblique resonator in the example of FIG. 9 are the same as those in the example of FIG. 7. On the other hand, in the elastic wave filter according to the comparative example (hereinafter, abbreviated as "comparative example"), both a series resonator and a parallel resonator are type-1 oblique resonators. Thus, the type of parallel resonator is different between the example and the comparative example.

In the graph with reference sign 9000A in FIG. 9, a vertical axis indicates the amount of attenuation (unit: dB). In the graph, the solid line indicates the characteristics of the example, and the dotted line indicates the characteristics of the comparative example. The amount of attenuation can also be rephrased as the amount of transmission. Therefore, the attenuation characteristics can also be rephrased as transmission characteristics. In the graph, a band Bd1 is a passband of the elastic wave filter that is determined in advance by the standard. In the example of FIG. 9, the band Bd1 is, for example, Band66Tx.

The graph with reference sign 9000B in FIG. 9 shows the phase characteristics of one parallel resonator in each of the example and the comparative example. Accordingly, in the graph, the solid line indicates the phase characteristics of the type-2 oblique resonator, and the dotted line indicates the phase characteristics of the type-1 oblique resonator. The phase characteristics shown in the graph are equivalent to the phase characteristics shown in the graph with reference sign 7000B in FIG. 7 described above. However, in the graph with reference sign 9000B in FIG. 9, the range of the horizontal axis is made to coincide with that of the graph with reference sign 9000A.

As described above, the stopband spurious of the type-1 oblique resonator is lower in frequency than the stopband spurious of the type-2 oblique resonator. Therefore, in the comparative example, the stopband spurious of the type-1 oblique resonator being a parallel resonator is located within the passband of the elastic wave filter. In the example of FIG. 9, the stopband spurious of the type-1 oblique resonator is located within the band Bd1. Accordingly, in the comparative example, the stopband spurious of the type-1 oblique resonator being a parallel resonator may adversely affect the band-pass characteristics of the frequency filter.

On the other hand, in the example, the stopband spurious of the type-2 oblique resonator being a parallel resonator is located outside the passband of the elastic wave filter (more specifically, on the high frequency side relative to the passband of the elastic wave filter). In the example of FIG. 9, the stopband spurious of the type-2 oblique resonator is located on the high frequency side of the band Bd1. Accordingly, in the example, the stopband spurious of the type-2 oblique resonator being a parallel resonator does not adversely affect the band-pass characteristics of the frequency filter.

From the above, in an elastic wave filter (for example, the elastic wave filter 100) according to an aspect of the present disclosure, at least one of the at least one parallel resonator may be a type-2 oblique resonator. The stopband spurious of the type-2 oblique resonator may be located on the higher frequency side relative to the passband of the elastic wave filter. This configuration can improve the band-pass characteristics of the elastic wave filter.

In the elastic wave filter according to an aspect of the present disclosure, all of the at least one parallel resonator may be type-2 oblique resonators. This configuration can further improve the band-pass characteristics of the elastic wave filter.

In addition, in the elastic wave filter according to an aspect of the present disclosure, the at least one series resonator may be a type-1 oblique resonator. As described above, the type-1 oblique resonator can more effectively reduce resonance loss by more effectively reducing transverse mode spurious. Therefore, by using the type-1 oblique resonator as a series resonator, the loss characteristics of the elastic wave filter can also be improved.

As above, in an aspect of the present disclosure, a type-1 oblique resonator may be used as a series resonator, and a type-2 oblique resonator may be used as a parallel resonator. In this way, by using different types of oblique resonators for a series resonator and a parallel resonator, an elastic wave filter with good frequency characteristics (specifically, good band-pass characteristics and loss characteristics) can be implemented. That is, the frequency characteristics of the elastic wave filter can be improved compared to the related art.

In the elastic wave filter according to an aspect of the present disclosure, the stopband spurious of a type-2 oblique resonator (parallel resonator) may be located on a higher frequency side than the stopband spurious of each of at least one type-1 oblique resonator (series resonator). This configuration can further improve the band-pass characteristics of the elastic wave filter.

Supplementary Item for First Embodiment (1) In the present specification, the "position of the stopband spurious" may be understood to indicate, for example, the "value of a stopband spurious frequency of a certain resonator". The stopband spurious frequency may be understood to mean, for example, a peak frequency of the stopband spurious.

Therefore, the fact that "stopband spurious is located within the passband of the elastic wave filter" means, for example, that the "stopband spurious frequency of the certain resonator is equal to or more than a lower limit and equal to or less than an upper limit of a frequency in the passband". On the other hand, the fact that "stopband spurious is located on the higher frequency side relative to the passband of the elastic wave filter" means, for example, that the "stopband spurious frequency of the certain resonator is higher than the upper limit of the frequency in the passband".

(2) As described above, the present specification takes into consideration the technical matter that "Dutyd3 and Dutyd4 are substantially equal to Duty3 and Duty4 in at least a part of the second intersection region" for the second IDT electrode. The above numerical range indicating "substantially equal" may be set, for example, as a "numerical range in which the type-2 oblique resonator is expected not to adversely affect the band-pass characteristics of the frequency filter".

That is, the above numerical range indicating "substantially equal" may be set from the viewpoint of the feasibility of the effect of the type-2 oblique resonator, that is, "improving the band-pass characteristics of the frequency filter". The example in the first embodiment of "within a range of ±0.08" is an example of a numerical range in which the feasibility of the effect has been supported by the study of the inventors of the present application.

However, the above numerical range indicating "substantially equal" may also be set according to another standard. For example, the numerical range may also be set as a "numerical range in which Duties can be considered to be substantially equal in the manufacturing process of the second IDT electrode". In this way, the numerical range may also be set from the viewpoint of the manufacturing process of the second IDT electrode.

As an example, from the viewpoint of the manufacturing process of the second IDT electrode, when a variation between Duties is within a range of ±0.025, the Duties can be considered to be substantially equal. In an aspect of the present disclosure, Dutyd3 and Dutyd4 may be within a range of ±0.025 with respect to Duty3 and Duty4 in at least a part of the second intersection region. ±0.025 is a numerical range narrower than ±0.08. Accordingly, this configuration can more effectively improve the band-pass characteristics of the elastic wave filter.

Second Embodiment

Figure 10:
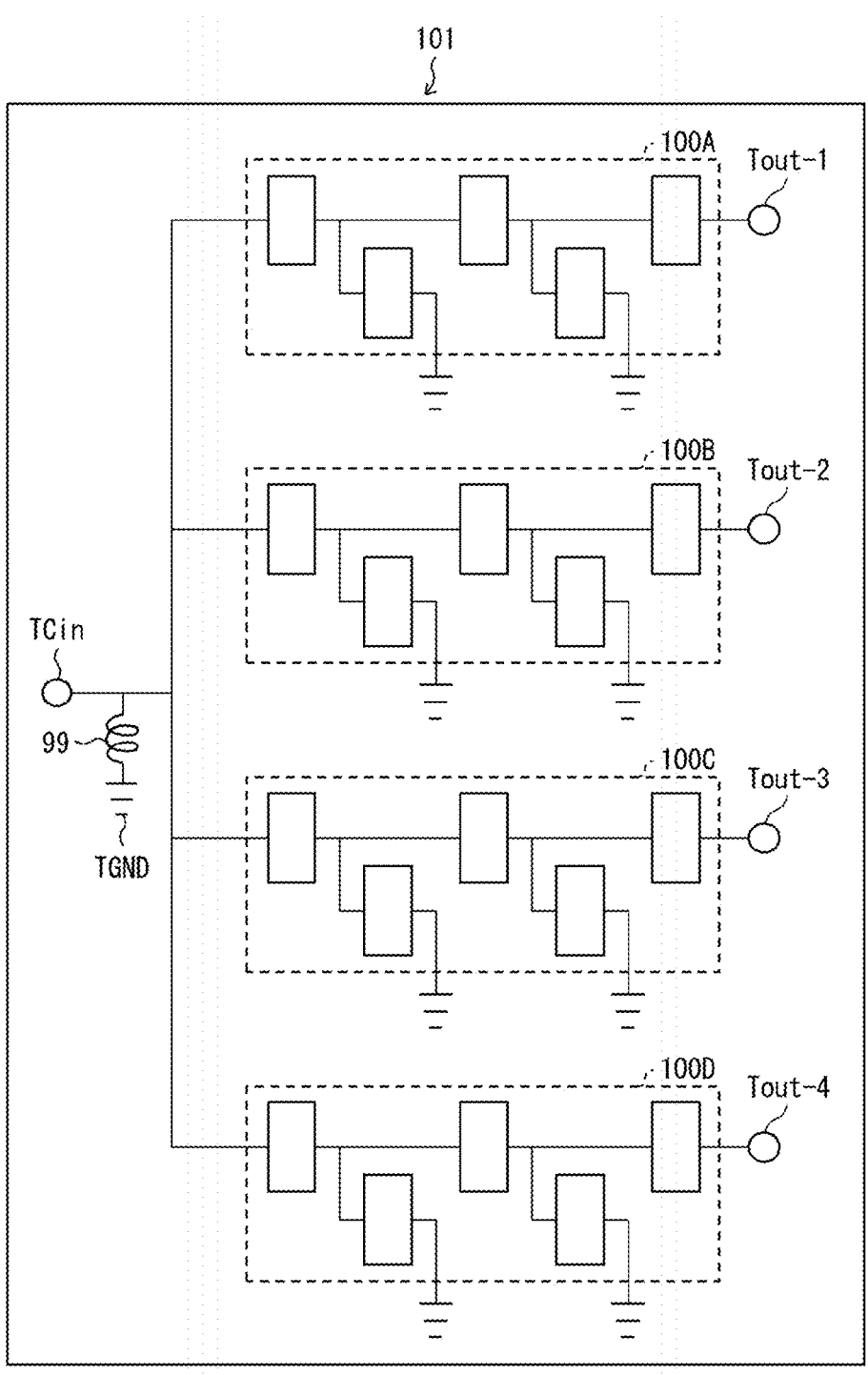
FIG. 10 is a diagram illustrating a configuration example of a demultiplexer in a second embodiment.

FIG. 10 is a diagram illustrating a configuration example of a demultiplexer 101 in a second embodiment. The demultiplexer is also referred to as a multiplexer. As illustrated in FIG. 10, the demultiplexer 101 may include a plurality of elastic wave filters 100. In the example of FIG. 10, the demultiplexer 101 includes four elastic wave filters 100 (for example, ladder-type filters). In FIG. 10, the demultiplexer 101 is an example of a quadplexer. In the following description, the four elastic wave filters 100 are referred to as a first filter 100A, a second filter 100B, a third filter 100C, and a fourth filter 100D, respectively.

As illustrated in FIG. 10, at least two of the plurality of elastic wave filters may be connected to a common input terminal TCin. As an example, TCin may be an antenna terminal (also see a third embodiment to be described below). In the example of FIG. 10, the first filter 100A to the fourth filter 100D are connected to TCin. In this way, all of the plurality of elastic wave filters may also be connected to TCin.

TCin may be connected to TGND via a reactor 99. The first filter 100A to the fourth filter 100D may be connected to individual output terminals, respectively. As illustrated in FIG. 10, the first filter 100A to the fourth filter 100D may be connected to output terminals Tout-1 to Tout-4, respectively.

The first filter 100A to the fourth filter 100D may be located on the same chip. In this case, resonators of the first filter 100A to the fourth filter 100D may have the common support substrate 98. Therefore, the thickness of the support substrate 98 may be common to the resonators. In addition, each resonator may include the common piezoelectric film 2 and low acoustic velocity film 8. Therefore, Tp and Ti may be common to the resonators. Moreover, each resonator may be formed by, for example, a common film formation process. Therefore, s may be common to the resonators.

Third Embodiment

Figure 11:
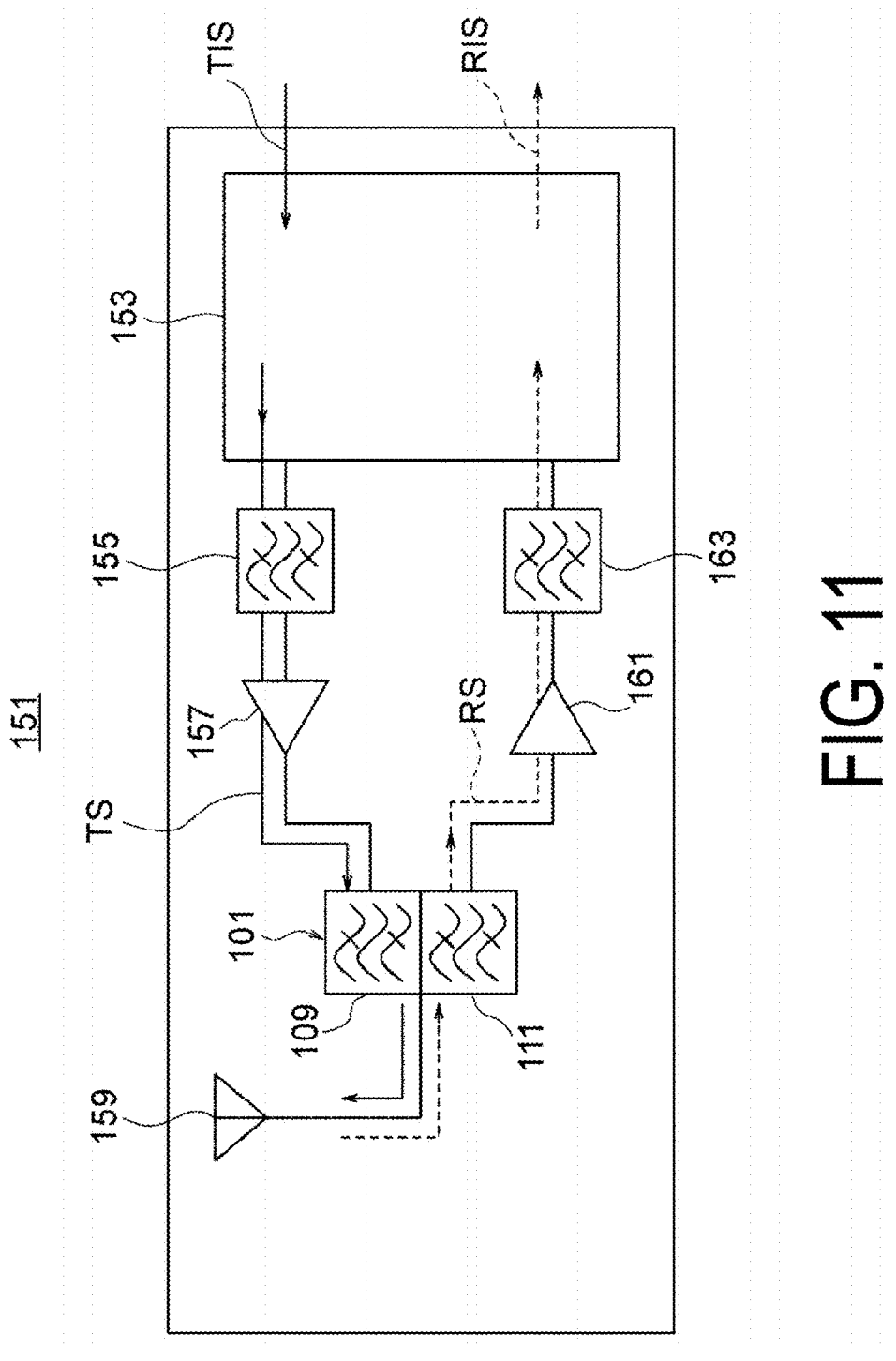
FIG. 11 is a diagram illustrating a schematic configuration of a communication apparatus in a third embodiment.

FIG. 11 is a diagram illustrating a schematic configuration of a communication apparatus 151 in the third embodiment. The communication apparatus 151 is an application example of the elastic wave filter according to an aspect of the present disclosure, and performs wireless communication using radio waves. The communication apparatus 151 may include the above-described demultiplexer 101. In the example of FIG. 11, the communication apparatus 151 may include one demultiplexer 101 as a transmission filter 109 and another demultiplexer 101 as a reception filter 111.

In the communication apparatus 151, a transmission information signal TIS including information to be transmitted may be subjected to modulation and an increase in frequency (conversion to a high-frequency signal having a carrier wave frequency) by a radio frequency-integrated circuit (RF-IC) 153, and converted into a transmission signal TS. A band-pass filter 155 may remove unnecessary components from the TS other than a transmission passband. Subsequently, the TS subjected to the unnecessary component removal may be amplified by an amplifier 157 and input to the transmission filter 109.

The transmission filter 109 may remove unnecessary components from the input transmission signal TS other than the transmission passband. The transmission filter 109 may output the TS subjected to the unnecessary component removal to an antenna 159 via an antenna terminal (for example, the above-described TCin). The antenna 159 may convert the TS, which is an electrical signal input to the antenna 159, into radio waves as a wireless signal, and transmit the radio waves to the outside of the communication apparatus 151.

The antenna 159 may convert externally received radio waves into a received signal RS being an electrical signal, and input the RS to the reception filter 111 via the antenna terminal. The reception filter 111 may remove unnecessary components from the input RS other than a reception passband. The reception filter 111 may output the received signal RS subjected to the unnecessary component removal to an amplifier 161. The output RS may be amplified by the amplifier 161. A band-pass filter 163 may remove unnecessary components from the amplified RS other than the reception passband. The RS subjected to the unnecessary component removal may be subjected to a decrease in frequency and demodulation by the RF-IC 153, and converted into a reception information signal RIS.

The TIS and RIS may be low-frequency signals (baseband signals) including appropriate information. For example, the TIS and RIS may be analog voice signals or digitized voice signals. The passband of the wireless signal may be appropriately set or may conform to various known standards.

Supplementary Note

In the present disclosure, the invention has been described above based on the various drawings and examples. However, the invention according to the present disclosure is not limited to each embodiment described above. That is, the embodiments of the invention according to the present disclosure can be modified in various ways within the scope illustrated in the present disclosure, and embodiments obtained by appropriately combining the technical means disclosed in different embodiments are also included in the technical scope of the invention according to the present disclosure. In other words, a person skilled in the art can easily make various variations or modifications based on the present disclosure. Note that these variations or modifications are included within the scope of the present disclosure.

REFERENCE SIGNS 1S, 1SV Series resonator (type-1 oblique resonator)
1P, 1PV Parallel resonator (type-2 oblique resonator)
2 Piezoelectric film
3 First IDT electrode
5 Second IDT electrode
8 Low acoustic velocity film
9 High acoustic velocity film
21A Third bus bar
21B Fourth bus bar
23A Third electrode finger
23B Fourth electrode finger
25A Third dummy electrode finger
25B Fourth dummy electrode finger
31*a* First bus bar
31*b* Second bus bar
32*a* First electrode finger
32*b* Second electrode finger
35*a* First dummy electrode finger
35*b* Second dummy electrode finger
98 Support substrate
100 Elastic wave filter 100A to 100D First filter to fourth filter (elastic wave filters)
101 Demultiplexer
151 Communication apparatus
159 Antenna
TCin Common input terminal (antenna terminal)

The invention claimed is:

1. An elastic wave filter comprising:

at least one series resonator comprising a first IDT electrode; and at least one parallel resonator comprising a second IDT electrode, wherein the at least one series resonator and the one parallel resonator comprise a common piezoelectric film, the first IDT electrode comprises:

a first bus bar and a second bus bar facing each other in a direction intersecting a propagation direction of an elastic wave propagating through the piezoelectric film;

a plurality of first electrode fingers connected to the first bus bar;

a plurality of second electrode fingers connected to the second bus bar and interleaved with the plurality of first electrode fingers;

a plurality of first dummy electrode fingers connected to the first bus bar and facing tips of the plurality of second electrode fingers, respectively; and a plurality of second dummy electrode fingers connected to the second bus bar and facing tips of the plurality of first electrode fingers, respectively, a direction in which the tips of the plurality of first electrode fingers are connected and a direction in which the tips of the plurality of second electrode fingers are connected are inclined with respect to the propagation direction, the second IDT electrode comprises:

a third bus bar and a fourth bus bar facing each other in the direction intersecting the propagation direction;

a plurality of third electrode fingers connected to the third bus bar;

a plurality of fourth electrode fingers connected to the fourth bus bar and interleaved with the plurality of third electrode fingers;

a plurality of third dummy electrode fingers connected to the third bus bar and facing tips of the plurality of fourth electrode fingers, respectively; and a plurality of fourth dummy electrode fingers connected to the fourth bus bar and facing tips of the plurality of third electrode fingers, respectively, a direction in which the tips of the plurality of third electrode fingers are connected and a direction in which the tips of the plurality of fourth electrode fingers are connected are inclined with respect to the propagation direction, in the at least one series resonator, a duty of the first dummy electrode fingers and a duty of the second dummy electrode fingers are greater than a duty of the first electrode fingers and a duty of the second electrode fingers in at least a part of a first intersection region where the first electrode fingers and the second electrode fingers intersect with each other, a duty at a base portion of the first electrode fingers and a duty at a base portion of the second electrode fingers are greater than the duty of the first electrode fingers and the duty of the second electrode fingers in at least a part of the first intersection region, and in at least one of the at least one parallel resonator, a duty of the third dummy electrode fingers and a duty of the fourth dummy electrode fingers are within a range of ±0.08 with respect to a duty of the third electrode fingers and a duty of the fourth electrode fingers in at least a part of a second intersection region where the third electrode fingers and the fourth electrode fingers intersect with each other, and a duty at a base portion of the third electrode fingers and a duty at a base portion of the fourth electrode fingers are within a range of ±0.08 with respect to the duty of the third electrode fingers and the duty of the fourth electrode fingers in at least a part of the second intersection region.

2. The elastic wave filter according to claim 1, wherein, in all of the at least one parallel resonator, the duty of the third dummy electrode fingers and the duty of the fourth dummy electrode fingers are within a range of ±0.08 with respect to the duty of the third electrode fingers and the duty of the fourth electrode fingers in at least a part of the second intersection region, and the duty at the base portion of the third electrode fingers and the duty at the base portion of the fourth electrode fingers are within a range of ±0.08 with respect to the duty of the third electrode fingers and the duty of the fourth electrode fingers in at least a part of the second intersection region.

3. The elastic wave filter according to claim 1, wherein stopband spurious of the at least one parallel resonator is located on a higher frequency side relative to a passband of the elastic wave filter.

4. The elastic wave filter according to claim 1, wherein the stopband spurious of the at least one parallel resonator is located on a higher frequency side than stopband spurious of a series resonator on the lowest frequency side out of stopband spurious of the at least one series resonator.

5. The elastic wave filter according to claim 1, wherein the duty of the first dummy electrode fingers and the duty of the second dummy electrode fingers are 0.08 or more greater than the duty of the first electrode fingers and the duty of the second electrode fingers in at least a part of the first intersection region.

6. The elastic wave filter according to claim 5, wherein the duty of the first dummy electrode fingers and the duty of the second dummy electrode fingers are within a range from +0.08 to +0.16 with respect to the duty of the first electrode fingers and the duty of the second electrode fingers in at least a part of the first intersection region.

7. The elastic wave filter according to claim 1, wherein the duty of the first dummy electrode fingers and the duty of the second dummy electrode fingers are greater than the duty of the first electrode fingers and the duty of the second electrode fingers in a center portion of the first intersection region.

8. The elastic wave filter according to claim 7, wherein the duty of the first dummy electrode fingers and the duty of the second dummy electrode fingers are greater than the duty of the first electrode fingers and the duty of the second electrode fingers in the entire of the first intersection region.

9. The elastic wave filter according to claim 1, wherein the at least one series resonator and the one parallel resonator comprise a common support substrate, and when a wavelength $\lambda$ of the elastic wave is defined as twice a length of an electrode finger pitch of the second IDT electrode, a thickness of the piezoelectric film is $\lambda$ or less.

10. The elastic wave filter according to claim 9, wherein the support substrate has an acoustic velocity higher than an acoustic velocity of the elastic wave.

11. The elastic wave filter according to claim 10, wherein the at least one series resonator and the one parallel resonator comprise a common low acoustic velocity film between the piezoelectric film and the support substrate, the common low acoustic velocity film having an acoustic velocity lower than the acoustic velocity of the elastic wave.

12. The elastic wave filter according to claim 11, wherein the at least one series resonator and the one parallel resonator comprise a common high acoustic velocity film between the piezoelectric film and the low acoustic velocity film, the common high acoustic velocity film having an acoustic velocity higher than the acoustic velocity of the elastic wave.

13. The elastic wave filter according to claim 1, wherein the piezoelectric film is an LT film.

14. The elastic wave filter according to claim 1, wherein the elastic wave filter is a ladder-type filter.

15. The elastic wave filter according to claim 1, wherein the elastic wave filter is a multimode filter.

16. A demultiplexer comprising:

a plurality of the elastic wave filters according to claim 1, wherein at least two of the plurality of elastic wave filters are connected to a common antenna terminal.

17. A communication apparatus comprising the demultiplexer according to claim 16.

* * * * *